United States Patent
Tang et al.

(10) Patent No.: US 10,169,142 B2
(45) Date of Patent: Jan. 1, 2019

(54) GENERATING PARITY FOR STORAGE DEVICE (71) Applicant: Futurewei Technologies, Inc., Plano, TX (US)

(72) Inventors: Xiangyu Tang, Canada (CA); Yunxiang Wu, Cupertino, CA (US)

(73) Assignee: Futurewei Technologies, Inc., Plano, TX (US)

( * ) Notice: Subject to any disclaimer, the term of this patent is extended or adjusted under 35 U.S.C. 154(b) by 71 days.

(21) Appl. No.: 15/208,583

(22) Filed: Jul. 12, 2016

(65) Prior Publication Data

US 2018/0018223 A1 Jan. 18, 2018

(51) Int. Cl.
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0688* (2013.01); *G11C 29/52* (2013.01)

(58) Field of Classification Search
CPC .................................................. G06F 11/1068
See application file for complete search history.

(56) References Cited

U.S. PATENT DOCUMENTS

| | | | | |
|---|---|---|---|---|
| 8,327,226 B2* | 12/2012 | Rub | ...................... | H03M 13/05 |
| | | | | 714/763 |
| 9,159,422 B1* | 10/2015 | Lee | .................. | G11C 16/04 |
| 9,318,166 B2* | 4/2016 | Sharon | ................ | G06F 11/1044 |
| 9,652,157 B2* | 5/2017 | Fisher | .................. | G06F 3/0611 |
| 9,811,419 B2* | 11/2017 | Camp | .................. | G06F 11/108 |
| 2013/0031301 A1* | 1/2013 | Barndt | ................ | G06F 12/0246 |
| | | | | 711/103 |
| 2013/0246891 A1* | 9/2013 | Manning | ............... | G06F 11/108 |
| | | | | 714/773 |
| 2014/0245097 A1* | 8/2014 | Larsen | ............. | H03M 13/2906 |
| | | | | 714/755 |
| 2015/0058697 A1* | 2/2015 | Iwasaki | ............... | G06F 11/1048 |
| | | | | 714/773 |
| 2016/0026525 A1* | 1/2016 | Barndt | ................ | G06F 11/1068 |
| | | | | 714/773 |

* cited by examiner

*Primary Examiner* — Steve N Nguyen
(74) *Attorney, Agent, or Firm* — Futurewei Technologies, Inc.

(57) ABSTRACT

A method is performed by a solid state device (SSD) controller to generate a parity. The method includes receiving input data to be stored to pages of a storage device, wherein each page is capable of being allocated with multiple codewords; configuring codewords of the pages into multiple groups, wherein each group has an integer number of codewords, at least one of the pages is allocated with a non-integer number of codewords, and wherein the integer number is larger than the non-integer number; obtaining parities for the multiple groups, and storing the parities to reserved spaces of the storage device. With the calculation of a parity decoupled from physical pages, the selection of a rate of code used is unconstrained by an integer number of codewords per page.

20 Claims, 6 Drawing Sheets

GENERATING PARITY FOR STORAGE DEVICE

BACKGROUND

Solid state storage devices, such as flash memory devices, are currently used for storing data. These devices are more used than conventional storage devices due to offering exceptional bandwidth, significant savings in power consumption, and random I/O (input/output) performance.

A data storage device contains data write locations known as "pages". Write operations are usually performed on a page basis. When a page fails, the data in the failed page should be recovered. So reliability is another key issue for data storage devices. The popular practice of protecting die failure in data storage devices is to use a dedicated parity die. Parity is computed for the input data written to each flash page by an exclusive OR Boolean operation (XOR). When a page fails, the data in the failed page can be recovered from other pages using the computed parity.

In practice, multiple codewords are allocated in a single page. When each page is allocated with an integer number of codewords, the data in the failed page can be recovered from other pages using the computed parity. Usually, applicable lengths of codewords are limited for each page to contain an integer number of codewords to generate parity for recovering correspondingly data when the page fails.

SUMMARY

This specification describes a parity generating process for a storage device.

Certain aspects of the subject matter described here can be implemented as a method performed by a controller. The controller receives input data to be stored to pages of a storage device, wherein each page is capable of being allocated with multiple codewords. The controller configures codewords of the pages into multiple groups, wherein each group has an integer number of codewords, wherein at least one of the pages is allocated with a non-integer number of codewords, and wherein the integer number is larger than the non-integer number. Then, the controller obtains parities for the multiple groups, and storing the parities to reserved spaces of the storage device.

In an example, the controller monitors a length of a codeword allocated in a page, and determines how many codewords allocated in the page by dividing a length of the page with the length of the codeword allocated in the page, wherein the integer number of codewords in a group is determined by how many codewords allocated in each page.

In another example, the integer number of codewords in a group is determined by a length of a page and lengths of codewords allocated in the page, wherein lengths of codewords are changed dynamically.

Certain aspects of the subject matter described here can be implemented as a controller configured to perform operations described here. Certain aspects of the subject matter described here can be implemented as a non-transitory computer-readable medium storing instructions executable by one or more processors to perform operations described here. Certain aspects of the subject matter described here can be implemented as a system including one or more processors and a computer-readable medium storing instructions executable by the one or more processors to perform operations described here.

With the calculation of parity decoupled from physical pages, the selection of the rate of code used is unconstrained by an integer number of codewords per page, and thus the best code rates can be used in order to maximize the lifespan and performance of the SSD.

The details of one or more implementations of the subject matter described in this specification are set forth in the accompanying drawings and the description below.

DETAILED DESCRIPTION

Figure 1:
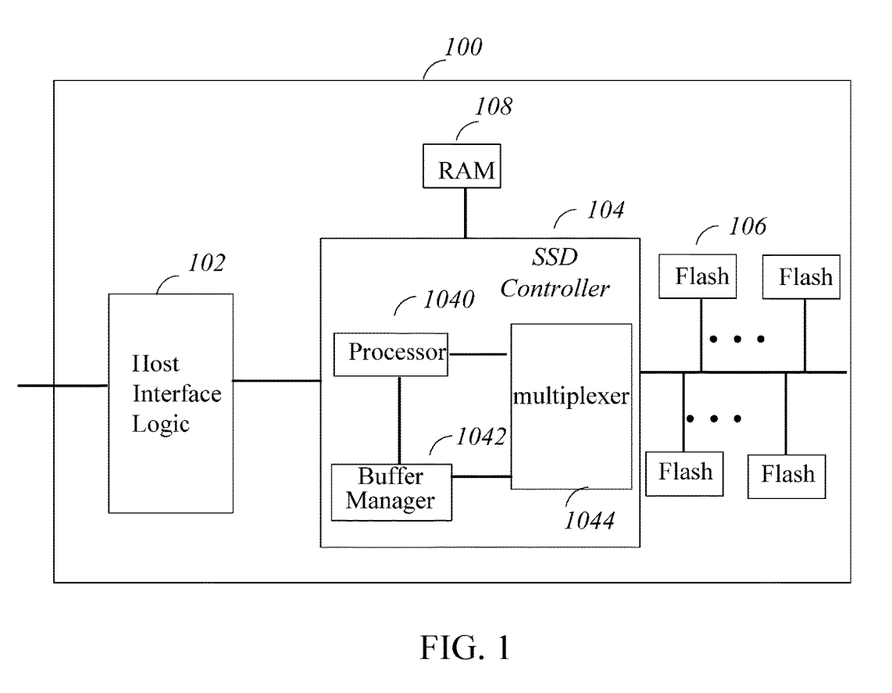
FIG. 1 is a block diagram of a solid state device or drive (SSD) according to an example embodiment.

All non-volatile based solid state devices or drives (SSDs) are constructed from an array of flash packages. FIG. 1 depicts a generalized block diagram for an SSD 100. The SSD 100 contains host interface logic 102 to support some form of physical host interface connection (Universal Serial Bus (USB), FiberChannel, Peripheral Component Interconnect (PCI) Express, Serial AT Attachment (SATA)) and logical disk emulation, like a flash translation layer mechanism to enable the SSD to mimic a hard disk drive. The bandwidth of the host interconnect is often a critical constraint on the performance of the device as a whole, and it must be matched to the performance available to and from the flash array. An SSD controller 104 includes a processor 1040, a buffer manager 1042, and a multiplexer 1044. The buffer manager 1042 holds pending and satisfied requests along the primary data path. The multiplexer (Flash Demux/Mux) 1044 emits commands and handles transport of data along the serial connections to the flash packages 106. The multiplexer 1044 can include additional logic, for example, to buffer commands and data. The processor 1040 is also required to manage the request flow and mappings from disk logical block address to physical flash location. The processor 1040, buffer-manager 1042, and multiplexer 1044 are typically implemented in a discrete component such as an application-specific integrated circuit (ASIC) or field-programmable gate array (FPGA), and data flow between these logic elements is very fast. The processor, and its associated RAM 108, may be integrated, as is the case for simple USB flash-stick devices, or standalone as for designs with more substantial processing and memory requirements.

In SSDs, the storage is organized into storage areas, or blocks, each of which contains a set of storage locations to which data can be written. Write locations are known as "pages". Usually, each page is capable of being allocated with an integer number of codewords. Length of a page may be $2^N$ KB, $N \geq 1$, such as 8 KB, 16 KB, and etc. To increase lifespan and performance of SSDs, variable rate error-correcting codes (ECC) can be used, including those which can result in a non-integer number of codewords allocated in a page. Current RAID single parity generation, however, does not support a non-integer number of codewords in a die (or page). Thus, a mechanism to allow parity generation for pages with a non-integer number of codewords can accommodate wider variations of variable rate ECC than the current single parity generation limited to an integer number of codewords per page.

Figure 2:
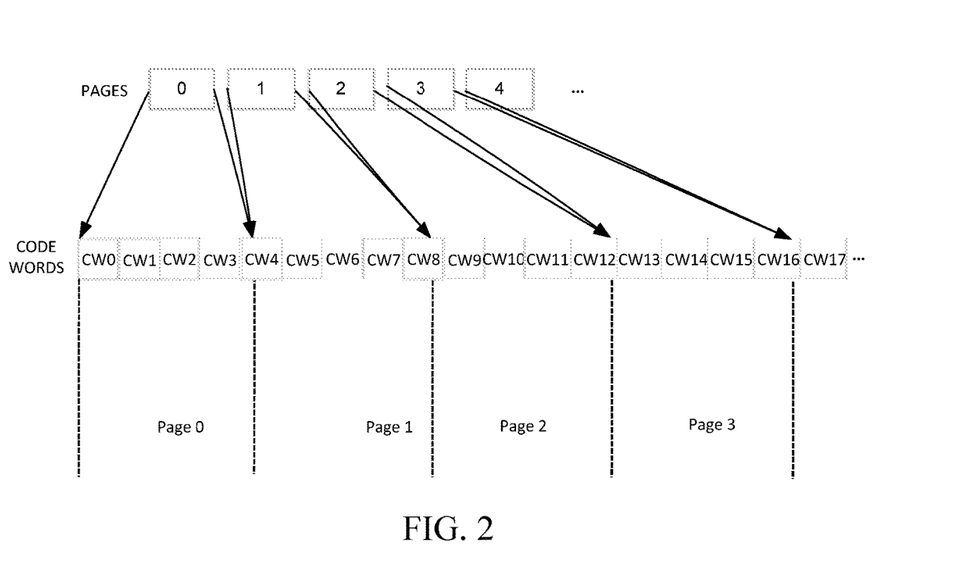
FIG. 2 is a block diagram illustrating a non-integer number of codewords allocated in some pages according to an example embodiment.

FIG. 2 is a block diagram illustrating codewords across pages. Page generally divides data into codewords, which may be at the bit level, byte level, page level, or any other desired quantity of data such as 512 bytes, 1024 bytes, larger powers of two, or other quantities. Assume that there are more than m but less than m+1 codewords in some pages. For example, page 0 includes codewords CW0, CW1, CW2, CW3, and part of CW4; page 1 includes codewords part of CW4, CW5, CW6, CW7, and part of CW8; page 2 includes codewords part of CW8, CW9, CW10, CW11, and part of CW12, and page 3 includes codewords part of CW12, CW13, CW14, CW15, and part of CW16. Each codeword may be identified by respective logical block addresses (LBAs).

Codewords can be configured into groups as, for example, columns or rows. If codewords are configured in rows, each column includes several pages in the SSD. A column, therefore, identifies a combination of pages. SSD may include parity information stored on one or more of the pages to insure that, if one page fails, the data on that page may be restored using the parity and data on other pages. Parity is computed for the input data written to each flash page by a Boolean exclusive OR operation (XOR).

Figure 3:
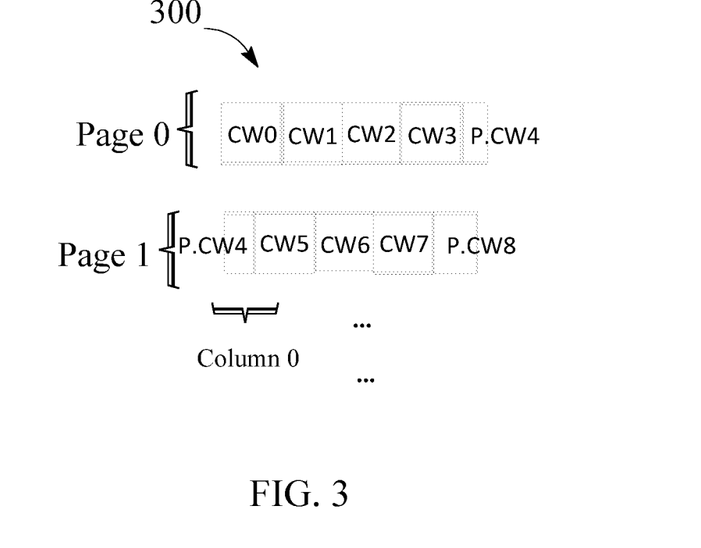
FIG. 3 is a block diagram illustrating a page failure according to an example embodiment.

FIG. 3 depicts an example when page 0 fails. When page 0 fails, data on CW0, CW1, CW2, CW3, and parts of CW4 are lost. However, because the number of bits in CW4 that are affected by the page failure is greater than the decoding capability of the code, none of CW4 can be recovered, including the bits in the page that have not failed. As a result, multiple bits need to be recovered in column 0. If only a single parity is calculated based on data in column 0, which only allows for the recovery of a single erased bit, column 0 is not able to recover all the failed bits.

This specification describes a mechanism or solution to recover data to allow a non-integer number of codewords to be allocated in a page. As described below, the controller configures an integer number of codewords as a group, and the parity is calculated based on groups, instead of based on pages. Usually, the integer number of codewords in each group is larger or equal to a "Max Impact Number (MIN)". Max Impact Number (MIN) is defined as maximum number of codewords that cannot be recovered when a page fails. The parity generation technique is independent of a length of a physical page in SSD. Furthermore, this technique is dynamically adjusted during the operations of the SSD to ensure that any single physical page failure is protected against.

If a length of a codeword is n, data's length in this codeword is k, and a length of a checksum of the codeword is n-k. Rate k/n is defined as the ratio between its data's length and its codeword's length. If codeword's length becomes shorter, the rate becomes higher. The quantity (1−k/n) measures the overhead that occurs due to the encoding with the codeword. If overhead is higher, the storage space is reduced. In this approach, multiple n can be selected when variable length ECC is used, and the best n can be chosen correspondingly in order to balance correction capability and storage space. Since the use of a non-integer number of codewords per physical page is allowed, constraints on selecting which rate of code to be used can be reduced. In fact, multiple coderates can be used within a single page. This allows the controller to optimize the lifespan and performance of SSDs.

Assume that there are more than m but less than m+1 codewords (e.g. a non-integer number of codewords) allocated in all pages, or in some pages, where m is an integer. MIN equals m+2 when a page includes 2 parts of codewords. Such as, there is 3 codewords (for example: CW5, CW6 and CW7), and 2 parts of codewords (for example: CW4, and CW8) in page 1 as illustrated by FIG. 2, thus m=3, MIN=5. MIN equals m+1 when a page includes a part of codeword. Such as, there is four codewords (for example: CW0, CW1, CW2 and CW3), and a part of codeword (for example: CW4) in page 0 as illustrated by FIG. 2, thus m=4, MIN=5.

In one embodiment, different pages may have different number of codewords, correspondingly have different MINs, such as MIN of a page is MIN1, MIN of another page is MIN2. SSD selects the Max (MIN1, MIN2) as the final MIN of the SSD device. That means: if MIN1>MIN2, MIN=MIN1; if MIN1<MIN2, MIN=MIN2. Different pages of the SSD may be configured based on a single MIN (e.g. the final MIN determined) at a time. During the lifespan of the SSD, separate MINs' (e.g. having different or same values) may be selected, identified or determined to configure the pages at different points in time.

A rate, and therefore a length (or size) of the codeword can be configured differently during the lifespan of a storage device. For example, the length of a codeword is 512 bytes at one time and is changed to 1024 bytes at another time during the operational lifespan of the SSD. The controller can monitor the rate of the codes used within a page, and calculate the MIN. The controller knows how many codewords in a page by page's length/codeword's length. For example, MIN may be obtained according to MIN=⌈page's length/codeword's length⌉+1 or MIN=⌊page's length/codeword's length⌋+2, where ⌊ ⌋ indicates rounding page's length/codeword's length down, and ⌈ ⌉ indicates rounding page's length/codeword's length up. MIN would be adjusted dynamically when the rate of the codes change, and correspondingly this will significantly improve lifespan and performance of SSD.

Figure 4A:
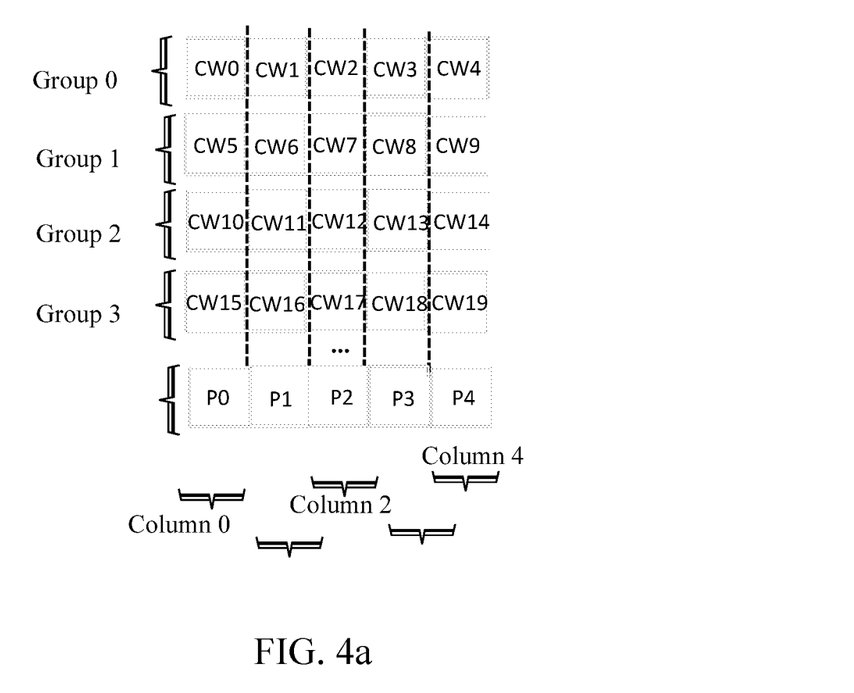
FIG. 4a is a block diagram illustrating calculating parity according to an example embodiment.
Figure 4B:
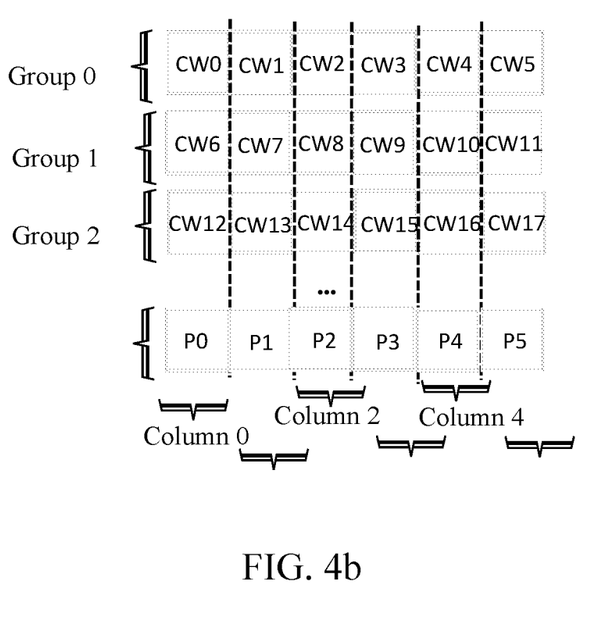
FIG. 4b is a block diagram illustrating calculating parity according to an example embodiment.

When MIN is decided, more than or equal to MIN codewords are configured as a group logically. FIG. 4a and FIG. 4b depict groups of codewords in SSD. Here the MIN=5, at least 5 codewords are configured as a group. Assuming 5 codewords are configured as a group in FIG. 4a, and 6 codewords are configured as a group in FIG. 4b.

In FIG. 4a, Group 0 includes CW0, CW1, CW2, CW3 and CW4. Group 1 includes CW5, CW6, CW7, CW8 and CW9. Group 2 includes CW10, CW11, CW12, CW13 and CW14. Group 3 includes CW15, CW16, CW17, CW18 and CW19. Perform XOR operations for each column to generate a parity for that column. Such as, parity 0 of column 0 is calculated by performing XOR operation for CW0, CW5, CW10 and CW15. Parity 1 of column 1 is calculated by performing XOR operation for CW1, CW6, CW11 and CW16. Parity 2 of column 2 is calculated by performing XOR operation for CW2, CW7, CW12 and CW17. Parity 3 of column 3 is calculated by performing XOR operation for CW3, CW8, CW13 and CW18. Parity 4 of column 4 is calculated by performing XOR operation for CW4, CW9, CW14 and CW19. Page 0 includes CW0, CW1, CW2, CW3, and part of CW4. If page 0 fails, CW0 can be recovered by P0, CW5, CW10 and CW15; CW1 can be recovered by P1, CW6, CW11 and CW16; CW2 can be recovered by P2, CW7, CW12 and CW17; CW3 can be recovered by P3, CW8, CW13 and CW18; CW4 can be recovered by P4, CW9, CW14 and CW19. So if MIN codewords are configured as a group logically, and parity is calculated for each column, data can be recovered when a page fails. In FIG. 4a, at least 5 codewords are reserved for the parities.

In FIG. 4b, Group 0 includes CW0, CW1, CW2, CW3, CW4 and CW5. Group 1 includes CW6, CW7, CW8, CW9, CW10 and CW11. Group 2 includes CW12, CW13, CW14, CW15, CW16 and CW17. Perform XOR operations for each column to generate a parity for that column. Such as, parity 0 of column 0 is calculated by performing XOR operation for CW0, CW6, and CW12. Parity 1 of column 1 is calculated by performing XOR operation for CW1, CW7, and CW13. Parity 2 of column 2 is calculated by performing XOR operation for CW2, CW8, and CW14. Parity 3 of column 3 is calculated by performing XOR operation for CW3, CW9 and CW15. Parity 4 of column 4 is calculated by performing XOR operation for CW4, CW10 and CW16. Parity 5 of column 5 is calculated by performing XOR operation for CW5, CW11 and CW17. Page 0 includes CW0, CW1, CW2, CW3, and part of CW4. If page 0 fails, CW0 can be recovered by P0, CW6 and CW12; CW1 can be recovered by P1, CW7 and CW13; CW2 can be recovered by P2, CW8 and CW14; CW3 can be recovered by P3, CW9 and CW15; CW4 can be recovered by P4, CW10 and CW16. So if MIN+1 codewords are configured as a group, and parity is calculated for each column, data can be recovered when a page fails. In FIG. 4b, at least 6 codewords are reserved for the parities.

The tables as shown in FIG. 4a and FIG. 4b can be stored on a persistent memory that can survive during power loss. In an alternative technique, tables as shown in FIG. 4a and FIG. 4b do not need to be stored on the SSD 100, and can be calculated when needed.

Spaces to be reserved for parities can be at the end of each page. This is a simple way to leave the end of each page empty. But, any spaces in the SSD can be reserved for parities. After the parities are generated, the parities are stored to the reserved spaces.

Figure 5:
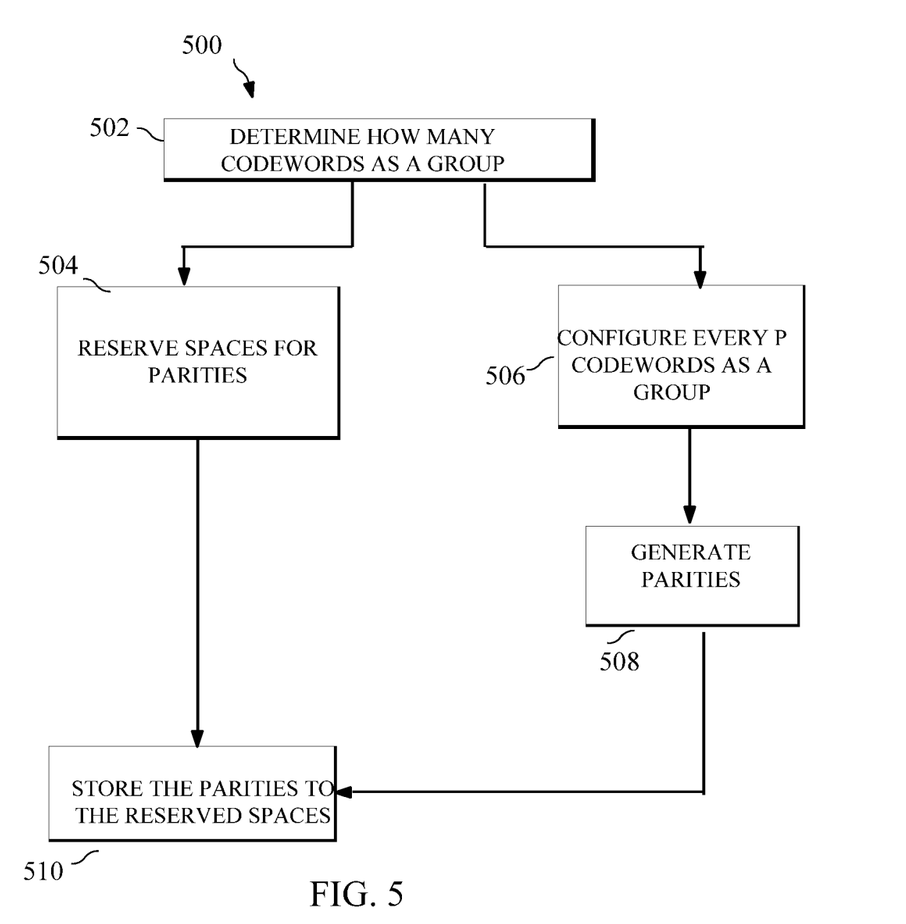
FIG. 5 is a flowchart illustrating a method of calculating parity according to an example embodiment.

FIG. 5 is an example of a process 500 to generate parities based on MIN codewords. In some implementations, the process 500 can be implemented by a controller, for example, the SSD controller 104. The controller can be connected to each flash in the flash array, and can be configured to execute instructions to perform operations including writing data to the flashes, deleting data from the flashes, and determining parity data and parity inconsistencies (for example, by performing XOR operations).

The controller monitors the rates of the codes constantly. At 502, the controller determines how many codewords are configured as a group. The controller knows how many codewords in a page by noting the rates of codes used in this page. Max Impact Number (MIN), which is the maximum number of codewords that cannot be recovered when a page fails, is determined according to how many codewords in a page. The MIN can also be determined according to lengths of codewords and a length of a page. The controller then determines how many codewords as a group, such as p codewords. p is an integer, and is larger or equal to MIN. The controller reserve spaces for parities according to p at 504. The reserved spaces may be located at the end of each page, or at the middle of each page, or other spaces of each page physically. The reserved spaces may be continuous, or non-continuous. A simple way is to leave the end of each page empty for the reserved spaces.

After the controller determines the MIN, the controller can change it periodically. Or the controller can change it according to other user policies.

At 506, when receiving input data, the controller stores the input data page by page, and configures every p codewords as a group logically. Parities are generated based on the groups at 508. If every p codewords are stored in row, a parity is calculated in column, such as already discussed in FIG. 4a and FIG. 4b. The controller stores the generated parities to the reserved spaces at 510. So, the grouping used in calculating the parity is decoupled from physical pages.

There are two different approaches to generate parities. One approach is to generate parities group by group. When receiving input data, the controller configures first p codewords as a first group, and buffers the first group to a space. When the controller receives second p codewords as a second group, the controller performs operation (for example, XOR operation) on the first group and the second group to generate parities, and then buffers the operation result of the first group and the second group to the space. When the controller receives third p codewords as a third group, the controller performs operation on the third group and the operation result of the first group and the second group to generate parities, and then buffers the operation result of the first group, the second group and the third group to the space, and so on. The controller stores a final result to the reserved spaces till the end of the input data or till the number of groups exceeds a threshold. In this approach, the space needs to buffer at least p codewords. The threshold can be determined according to a policy beforehand.

Another approach is to generate parities by whole groups. When receiving input data, the controller configures first p codewords as a first group, and buffers the first group to a space. When the controller receives second p codewords as a second group, the controller buffers the second group to the space too. Until the end of the input data or till the number of groups exceeds a threshold, the controller performs operation on all groups, and then stores the operation result to the reserved spaces. In this approach, the space needs to buffer all the groups. Similarly, the threshold can be determined according to a policy beforehand.

When a page fails, the failed page needs to be rebuilt. Data of the failed page are regenerated using data of other pages in the SSD. For example, the data of the failed page can be determined by performing exclusive Boolean OR operations. Such as, the page 0 fails as an example.

Figure 6:
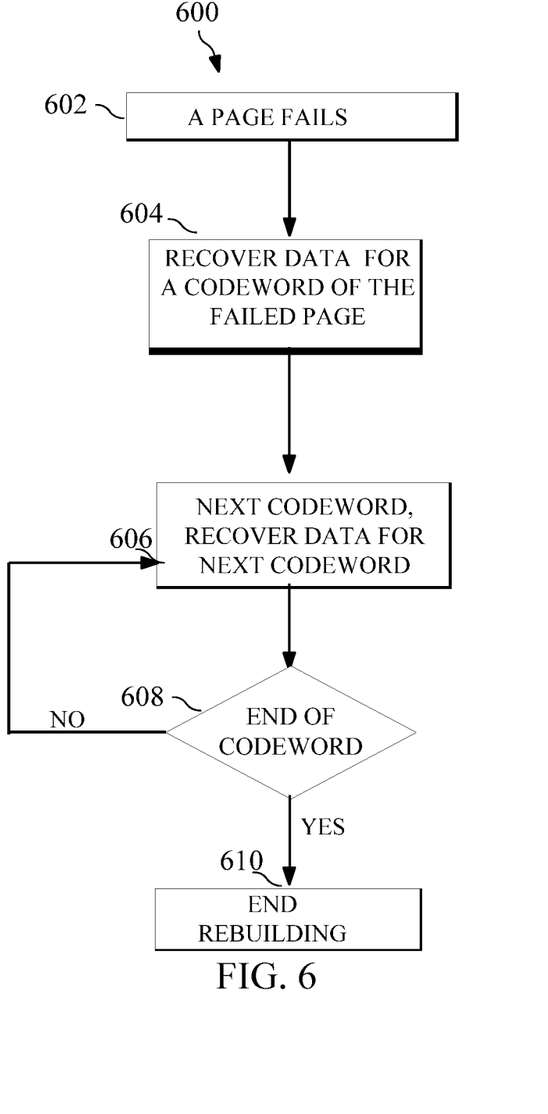
FIG. 6 is a flowchart illustrating a method of recovering data when a page fails according to an example embodiment.

FIG. 6 is a schematic diagram showing rebuilding (or recovering, or reconstructing) of the failed page according to an example embodiment. In some implementations, the rebuilding process can be implemented by a controller, for example, the SSD controller 104.

At 602, a page, such as page 0, fails. Especially, the controller monitors status of every page. So the controller knows which page fails, and which page is healthy. The data to be recovered for a codeword of page 0 is obtained by performing XOR operations at 604.

Take FIG. 4a as an example, data to be written to CW0 is obtained by performing XOR operations on other data of the column 0 as shown in Equation 1.

$$D(CW0)=D(CW5)\,XOR\,D(CW10)\,XOR\,D(CW15)\,XOR\,D(P0) \quad \text{(Eq. 1)}$$

After CW0 is recovered, the controller continues to recover next codeword of the failed page at 606. If the next codeword is not the end of the failed page at 608, the controller repeats step 606 till the recovering process ends at 610.

Similarly, data to be written to CW1 is obtained by performing XOR operations on other data of column 1 as shown in Equation 2.

$$D(CW1)=D(CW6)\,XOR\,D(CW11)\,XOR\,D(CW16)\,XOR\,D(P1) \quad \text{(Eq. 2)}$$

Data to be written to CW2 is obtained by performing XOR operations on other data of column 2 as shown in Equation 3.

$$D(CW2)=D(CW7)\text{XOR}D(CW12)\text{XOR}D(CW17)\text{XOR}D(P2) \quad \text{(Eq. 3)}$$

Data to be written to CW3 is obtained by performing XOR operations on other data of column 3 as shown in Equation 4.

$$D(CW3)=D(CW8)\text{XOR}D(CW13)\text{XOR}D(CW18)\text{XOR}D(P3) \quad \text{(Eq. 4)}$$

Data to be written to CW4 is obtained by performing XOR operations on other data of column 4 as shown in Equation 5.

$$D(CW4)=D(CW9)\text{XOR}D(CW14)\text{XOR}D(CW19)\text{XOR}D(P4) \quad \text{(Eq. 5)}$$

When a drive fails, the controller can rebuild codewords even if the codewords cross pages. Because the number of codewords in a group can be adjusted dynamically, reserved space overhead could be adjusted and reduced correspondingly to increase the usage rate of the storage space. With the calculation of parity decoupled from physical pages, the selection of the rate of code used is unconstrained by an integer number of codewords per page, and thus the best code rates can be used in order to maximize the lifespan and performance of the SSD.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

The invention claimed is:

1. A method performed by a solid state device (SSD) controller to generate a parity, the method comprising:
   receiving, by the SSD controller, input data to be stored to first and second pages of a storage device, wherein the first page is allocated with N codewords and at least one non-integer number of codeword, the second page is allocated with M codewords, N and M are integer, each non-integer number of codeword corresponding to a part of a codeword, and wherein a total number of codewords in the first page is different from a total number of codewords in the second page;
   determining, by the SSD controller, a max impact number (MIN) of the storage device dynamically, wherein the MIN is an integer no less than N+1 and no less than M;
   configuring, by the SSD controller, codewords of the first and second pages into multiple groups, wherein each group has an integer number of codewords, and wherein the integer number of codewords in each group is no less than the MIN;
   generating, by the SSD controller, parities for the multiple groups; and
   storing, by the SSD controller, the parities to reserved spaces of the storage device.

2. The method of claim 1, wherein the integer number of codewords in each group is no less than a maximum number of codewords that cannot be recovered when a page fails.

3. The method of claim 1, wherein the first page is allocated with two non-integer number of codewords, and wherein the MIN is no less than N+2 and no less than M.

4. The method of claim 1, further comprising:
   monitoring a length of a codeword allocated in the second page dynamically; and
   determining M by dividing the length of the second page with the length of the codeword allocated in the second page.

5. The method of claim 1, further comprising:
   monitoring a length of a codeword allocated in the first page dynamically; and
   determining N by dividing the length of the first page with the length of the codeword allocated in the first page and rounding down a result of the dividing.

6. The method of claim 5, wherein the length of the codeword in the first page is changed dynamically.

7. The method of claim 1, further comprising:
   determining the reserved space according to the integer number of codewords in each group.

8. The method of claim 1, and a sum of the total number of codewords in the first page and the total number of codewords in the second page is a non-integer number.

9. A solid state device (SSD) controller for generating a parity, comprising:
   a processor; and
   a memory coupled to the processor and storing programming for execution by the processor;
   the processor is configured to execute the programming to perform operations of:
   receiving input data to be stored to first and second pages of a storage device, wherein the first page is allocated with N codewords and at least one non-integer number of codeword, the second page is allocated with M codewords, N and M are integer, each non-integer number of codeword corresponding to a part of a codeword, and wherein a total number of codewords in the first page is different from a total number of codewords in the second page;
   determining a max impact number (MIN) of the storage device dynamically, wherein the MIN is an integer no less than N+1 and no less than M;
   configuring codewords of the first and second pages into multiple groups, wherein each group has an integer number of codewords, and wherein the integer number of codewords in each group is no less than the MIN;
   generating parities for the multiple groups; and
   storing the parities to reserved spaces of the storage device.

10. The SSD controller of claim 9, wherein the first page is allocated with two non-integer number of codewords, and wherein the MIN is no less than N+2 and no less than M.

11. The SSD controller of claim 10, wherein the processor is further configured to execute the programming to perform operations of:
   monitoring a length of a codeword allocated in the second page dynamically; and
   determining M by dividing the length of the second page with the length of the codeword allocated in the second page.

12. The SSD controller of claim 9, wherein the processor is further configured to execute the programming to perform operations of:
   monitoring a length of a codeword allocated in the first page dynamically; and
   determining N by dividing the length of the first page with the length of the codeword allocated in the first page and rounding down a result of the dividing.

13. The SSD controller of claim 12, wherein the length of the codeword in the first page is changed dynamically.

14. The SSD controller of claim 9, the processor is further configured to execute the programming to perform operations of:
  determining the reserved spaces according to the integer number of codewords in each group.

15. A non-transitory computer readable medium storing a program causing a computer to execute:
  receiving input data to be stored to first and second pages of a storage device, wherein the first page is allocated with N codewords and at least one non-integer number of codeword, the second page is allocated with M codewords, N and M are integer, each non-integer number of codeword corresponding to a part of a codeword, and wherein a total number of codewords in the first page is different from a total number of codewords in the second page;
  determining a max impact number (MIN) of the storage device dynamically, wherein the MIN is an integer no less than N+1 and no less than M;
  configuring codewords of the first and second pages into multiple groups, wherein each group has an integer number of codewords, and wherein the integer number of codewords in each group is no less than the MIN;
  generating parities for the multiple groups; and
  storing the parities to reserved spaces of the storage device.

16. The non-transitory computer readable medium of claim 15, wherein the first page is allocated with two non-integer number of codewords, and wherein the MIN is no less than N+2 and no less than M.

17. The non-transitory computer readable medium of claim 16, wherein the program causing a computer to execute:
  monitoring a length of a codeword allocated in the first page dynamically; and
  determining N by dividing the length of the first page with the length of the codeword allocated in the first page and rounding down a result of the dividing.

18. The non-transitory computer readable medium of claim 15, wherein the reserved spaces are determined according to the integer number of codewords in each group.

19. The non-transitory computer readable medium of claim 15, wherein the program causing a computer to execute:
  monitoring a length of a codeword allocated in the second page dynamically; and
  determining M by dividing the length of the second page with the length of the codeword allocated in the second page.

20. The non-transitory computer readable medium of claim 15, wherein the integer number of codewords in each group is no less than a maximum number of codewords that cannot be recovered when a page fails.

* * * * *